United States Patent [19]
Kawaguchi et al.

[11] Patent Number: 5,419,972
[45] Date of Patent: May 30, 1995

[54] FRAME-SUPPORTED PELLICLE FOR DUSTPROOF PROTECTION OF PHOTOMASK

[75] Inventors: Sakae Kawaguchi; Yuichi Hamada; Toru Shirasaki; Yoshihiko Nagata; Meguru Kashida; Yoshihiro Kubota, all of Gunma, Japan

[73] Assignee: Shin-Etsu Chemical Co., Ltd., Tokyo, Japan

[21] Appl. No.: 287,778

[22] Filed: Aug. 9, 1994

[30] Foreign Application Priority Data

Sep. 2, 1993 [JP] Japan ................... 5-242053

[51] Int. Cl.⁶ .............................................. G03B 27/58
[52] U.S. Cl. .................................... 428/626; 428/651; 428/652; 428/654; 428/650
[58] Field of Search ............... 428/626, 650, 654, 651, 428/652

[56] References Cited

U.S. PATENT DOCUMENTS

| | | | |
|---|---|---|---|
| 4,443,098 | 4/1982 | Walwyn et al. | 355/74 |
| 5,286,567 | 2/1994 | Kubota et al. | 428/422 |
| 5,300,348 | 4/1994 | Kubota et al. | 428/194 |
| 5,311,250 | 5/1994 | Suzuki et al. | 355/76 |
| 5,327,808 | 7/1994 | Nagata et al. | 83/861 |

FOREIGN PATENT DOCUMENTS 60-220933 11/1985 Japan .
04007551 1/1992 Japan .

*Primary Examiner*—John Zimmerman
*Assistant Examiner*—Linda L. Gray
*Attorney, Agent, or Firm*—McAulay Fisher Nissen Goldberg & Kiel

[57] ABSTRACT

An improvement is proposed for a frame-supported pellicle for dustproof protection of a photomask, which consists of a rigid frame and a transparent plastic membrane adhesively bonded to one end surface of the frame in a slack-free fashion, used in the photolithographic patterning work for the manufacture of fine electronic parts and devices. The improvement is obtained by providing the whole surface of the pellicle frame made from an alluminum alloy with a metallic plating layer of nickel or chromium so as to completely solve the heretofore unavoidable problem by the dust particle deposition on the pellicle membrane during transportation and handling as a consequence of dust particle formation by contacting with the inner surface of the holder case by virtue of the extremely high smoothness of the metal-plated frame surface.

2 Claims, No Drawings

FRAME-SUPPORTED PELLICLE FOR DUSTPROOF PROTECTION OF PHOTOMASK

BACKGROUND OF THE INVENTION

The present invention relates to a frame-supported pellicle for dustproof protection of a photomask used in the patterning works for the manufacture of, for example, fine electronic materials such as semiconductor devices and liquid crystal display panels. More particularly, the invention relates to a frame-supported dustproof pellicle for a photomask, which is almost completely freed from the troubles due to occurrence of dust particles from the pellicle frame per se.

As is known, the photolithographic method is well established in the patterning works for the manufacture of semiconductor devices, such as LSIs, VLSIs and the like, liquid crystal display panels and other fine electronic materials, in which a photoresist layer formed on the surface of a substrate such as a semiconductor silicon wafer is pattern-wise irradiated with ultraviolet light through a pattern-bearing transparency called a photomask followed by development to form a patterned resist layer. In view of the extremely high fineness and precision required in this patterning work, it is very important that the photomask is absolutely dust-free since, when dust particles are deposited on the photomask, the ultraviolet light passing through the photomask is necessarily scattered by the dust particles to give a great adverse influence on the quality of the reproduced pattern such as fidelity to the photomask pattern and contrast of the reproduced images.

It is therefore a usual practice that the photolithographic patterning work is conducted in a clean room under an atmosphere of air freed from any floating dust particles as completely as possible although perfect cleanness can hardly be obtained even in a clean room of the highest class. Accordingly, it is also a usual practice that deposition of dust particles on the photomask is prevented by mounting a frame-supported dustproof pellicle on the photomask. The frame-supported dustproof pellicle mentioned above is an integral device consisting of a frame having parallel end surfaces and made from a rigid material, such as an aluminum alloy, and a thin, highly transparent film of a polymeric resin, which is called a pellicle membrane, spread over and adhesively bonded to one end surface of the pellicle frame in a drumhead-like slack-free fashion. Usually, the other end surface of the pellicle frame, reverse to the end surface to which the pellicle membrane is adhesively bonded, is coated with a pressure-sensitive adhesive so as to ensure reliableness of mounting of the pellicle frame on the photomask.

When a frame-supported pellicle is mounted on the photomask, the dust particles floating in the atmospheric air and falling therefrom are never deposited directly on the photomask but are deposited on the pellicle membrane. Since the light beams used for the pattern-wise exposure to light are focused at the patterned images on the photomask, the dust particles deposited on the pellicle membrane, which is held apart above the photomask by the height of the pellicle frame, have little adverse influences on the quality of the pattern reproduction in the photolithographic patterning work.

Needless to say, all of the products of frame-supported pellicles as manufactured receive very close inspection to ensure complete absence of dust particles deposited on the pellicle membrane before they are encased in a holder case and packaged for transportation and delivery to the users. Nevertheless, it is sometimes the case that dust particles, though very few, are found on the pellicle membrane of the frame-supported pellicle taken out of the unpacked case at the user's site. This trouble is due to nothing other than falling of dust particles held on a certain surface other than the pellicle membrane on to the pellicle membrane as a consequence of vibrations and shocks which the encased pellicle receives during transportation on a truck, railroad car or airplane as well as in handling of the packages. A surface of possibility thought of for such a surface other than the pellicle membrane, which holds the dust particles and from which the dust particles fall on to the pellicle membrane, is the surface of the pellicle frame. In this regard, it would be worthwhile to consider the material of the pellicle frames.

While pellicle frames are made from a rigid material including metallic materials such as aluminum alloys and stainless steels and plastic resins such as polyethylenes, the most conventional material of pellicle frames is an aluminum alloy in view of the high mechanical strengths for its low weight and the surface of the pellicle frame made from an aluminum alloy is usually provided with an oxide film by an anodization treatment to increase the surface hardness and the oxide film is colored in black to prevent stray light. When the surface of the pellicle frame of an aluminum alloy is anodized and colored in black, it has been found that the thus treated surface is microscopically far from smoothness but the anodized oxide film on the surface has a porous structure with ruggedness and is hard but brittle. Accordingly, it is not surprising that dust particles are formed in or from such a rugged and brittle surface of the pellicle frame under a force received in the course of manufacture thereof or by frictionally contacting with the inner surface of the holder case due to unavoidable vibrations and shocks during transportation and handling. For example, it would not be an impossible case that dust particles and particles of the black pigment enclosed in the pores of the porous oxide film on the frame surface are released and scattered into the space to be deposited on the pellicle membrane. The brittle surface layer on the pellicle frame would readily be broken into dust particles when the surface is contacted with the inner surface of the holder case under vibrations and shocks.

A proposal has been made in Japanese Patent Publication 63-777 and Japanese Patent Kokai 64-48062, according to which the inwardly facing surface of a pellicle frame is coated with a pressure-sensitive adhesive or with a sticky coating composition. This method is indeed not ineffective because any dust particles floating within the space surrounded by the frame-supported pellicle and the photomask, when the pellicle is mounted on the photomask, can be captured by hitting at the sticky surface. This method, however, cannot provide a solution for the above described problems in the prior art.

SUMMARY OF THE INVENTION

The present invention accordingly has an object to provide a novel and improved frame-supported pellicle for dustproof protection of a photomask used in the photolithographic patterning works for the manufacture of electronic devices, which is free from the above described problems and disadvantages in the prior art pellicles due to occurrence of dust particles from the surface of the pellicle frame.

Thus, the frame-supported pellicle provided by the present invention is an integral body which comprises:
(a) a frame made from an alloy mainly consisting of aluminum and provided on the whole surface with a metallic plating layer of nickel or chromium; and
(b) a transparent film of a plastic resin spread over and adhesively bonded to one of the end surfaces of the frame in a drumhead-like slack-free fashion.

DETAILED DESCRIPTION OF THE PREFERRED EMBODIMENTS

As is described above, the frame-supported pellicle of the present invention is an integral body consisting of a rigid frame and a thin, transparent plastic resin film as the pellicle membrane spread over and adhesively bonded to one of the end surfaces of the pellicle frame in a drumhead-like slack-free fashion. Characteristically and differently from the pellicle frames in conventional frame-supported pellicles, the frame is provided on the whole surface, not a part of the surface, with a metallic plating layer of nickel or chromium.

Since the plating layer of nickel or chromium on the pellicle frame is formed over the whole surface of the pellicle frame, the trouble due to occurrence of dust particles from the porous anodized surface of the pellicle frame during transportation and handling can be completely prevented because the thus nickel- or chromium-plated surface has near to perfect smoothness.

The material forming the pellicle frame of the inventive frame-supported pellicle is not particularly limitative provided that the frame made therefrom has rigidity including metallic materials such as stainless steels and aluminum alloys and plastic resins such as polyethylenes. Preferably, however, the material of the frame is an aluminum alloy such as various grades of duralumins in respect of the high mechanical strength for the lightness in weight. Although aluminum-based alloys are generally not highly corrosion-resistant, the corrosion resistance of the pellicle frame made from an aluminum alloy can be greatly improved by forming a metallic plating layer of nickel or chromium thereon.

It is essential that the pellicle frame is provided on the whole surface thereof with a metallic plating layer of nickel or chromium. The method for the plating is not particularly limitative including electrolytic plating and electroless plating although the electrolytic plating is preferred. The method of electrolytic plating can be conventional. For example, the electrolytic plating of nickel is performed in an electrolytic plating bath prepared by dissolving 100 to 120 parts by weight of nickel sulfate hexahydrate, 15 to 30 parts by weight of ammonium sulfate and 5 to 15 parts by weight of potassium chloride in a suitable volume of water with adjustment of the pH to 5.0 to 6.0 at a temperature of 40° to 60° C. for 10 to 60 minutes with application of a direct-current voltage to give a current density of 2 to 10 A/dm$^2$. The electrolytic plating of chromium is performed in an electrolytic plating bath prepared by dissolving 200 to 400 parts by weight of chromic acid anhydride, 5 to 20 parts by weight of barium acetate, 1 to 10 parts by weight of zinc acetate and 2 to 20 parts by weight of calcium acetate in a suitable volume of water at a temperature of 30° to 50° C. for 10 to 60 minutes with application of a direct-current voltage to give a current density of 50 to 100 A/dm$^2$.

The thickness of the metallic plating layer of nickel or chromium is at least 0.1 $\mu$m or, preferably, in the range from 1 to 50 $\mu$m. When the plating process is undertaken adequately, great improvements can be obtained in the surface roughness of the frame surface as compared with pellicle frames of an aluminum alloy as such or with frames of an aluminum alloy after an anodization treatment. In an example, the values of Ra and RMS representing the surface roughness were 0.351 $\mu$m and 0.413 $\mu$m on the surface of a frame made from an aluminum alloy having a composition of 90.5 Al-5.5 Zn-2.5 Mg-1.5 Cu as such and 0.597 $\mu$m and 0.741 $\mu$m on the surface of a frame made from an aluminum alloy after an anodization treatment while the values were 0.134 $\mu$m and 0.197 $\mu$m on a nickel-plated surface and 0.196 $\mu$m and 0.275 $\mu$m on a chromium-plated surface.

In the following, the frame-supported pellicle of the present invention is illustrated in more detail by way of examples and comparative examples-showing the advantages obtained therewith.

EXAMPLE

Square frames each having an outer side length of 100 mm, inner side length of 96 mm and height of 6 mm were prepared from the above mentioned aluminum alloy and subjected to electrolytic plating of nickel and chromium to give four nickel-plated and four chromium-plated frames. Thus, the frame was first subjected to degreasing under ultrasonic waves in a bath of hexane prior to the electrolytic plating. The electrolytic plating of nickel was performed in an electrolytic plating bath containing 110 parts by weight of nickel sulfate hexahydrate, 20 parts by weight of ammonium sulfate and 10 parts by weight of potassium chloride in a suitable volume of water at a temperature of 50° C. for 30 minutes at a current density of 6 A/dm$^2$. The electrolytic plating of chromium was performed in an electrolytic plating bath containing 300 parts by weight of chromic acid anhydride, 10 parts by weight of barium acetate, 5 parts by weight of zinc acetate and 10 parts by weight of calcium acetate in a suitable volume of water at a temperature of 40° C. for 30 minutes at a current density of 75 A/dm$^2$. The thickness of the metallic plating layer was 10 $\mu$m in each.

After cleaning in an ultrasonic cleaning water bath, a film of nitrocellulose having a thickness of 0.87 $\mu$m as the pellicle membrane was adhesively bonded to one end surface of each of the above prepared pellicle frames after metal plating in a slack-free fashion by using an epoxy resin-based adhesive in a conventional manner followed by trimming. The other end surface of the pellicle frame was coated with a silicone-based pressure-sensitive adhesive in a coating thickness of 0.5 mm and the adhesive surface was temporarily protected by attaching a removable sheet coated with a fluorocarbon resin-based releasing agent.

Separately for comparison, similar frame-supported pellicles were prepared by using a surface-anodized pellicle frame without providing a metallic plating layer.

After inspection of the pellicles to count the number of dust particles having a diameter of 0.3 $\mu$m or larger on the pellicle membrane by using a microscope, the thus completed frame-supported pellicle was encased in a fully cleaned holder case of polyethylene and packaged for transportation in a usual manner. A transportation test was undertaken for the encased and packaged pellicles on a truck over a distance of 1500 kilometers through a highway. The pellicles taken out of the unpackaged holder case after the transportation test were microscopically inspected for dust particles of 0.3 μm or larger on the pellicle membrane. The results were that, while only a single dust particle was detected in one of the four pellicles with a nickel-plated frame and in two of the four pellicles with a chromium-plated frame before the transportation test, absolutely no increase was noted in the number of dust particles in the pellicles with a nickel- or chromium-plated frame after the transportation test while 10, 4, 6 and 6 dust particles were detected after the transportation test on the four comparative pellicles on which only a single dust particle was detected in one of the four pellicles before the transportation test showing an increase of 6 dust particles per pellicle on average.

What is claimed is:

1. A frame-supported pellicle for dustproof protection of photomask which is an integral body comprising:
   (a) a frame made from an alloy mainly consisting of aluminum and provided on the whole surface with a metallic plating layer of nickel or chromium; and
   (b) a transparent film of a plastic resin spread over and adhesively bonded to one of the end surfaces of the frame in a slack-free fashion.

2. The frame-supported pellicle as claimed in claim 1 in which the metallic plating layer has a thickness in the range from 1 to 50 μm.

* * * * *